United States Patent
Yeh et al.

(10) Patent No.: US 9,857,020 B2
(45) Date of Patent: Jan. 2, 2018

(54) LIFTING STRUCTURE WITH ADJUSTABLE BEARING CAPACITY

(71) Applicant: SYNCMOLD ENTERPRISE CORP., New Taipei (TW)

(72) Inventors: Ching-Yi Yeh, New Taipei (TW); Juei-Hsien Wang, New Taipei (TW)

(73) Assignee: Syncmold Enterprise Corp., New Taipei (TW)

( * ) Notice: Subject to any disclaimer, the term of this patent is extended or adjusted under 35 U.S.C. 154(b) by 0 days.

(21) Appl. No.: 15/003,162

(22) Filed: Jan. 21, 2016

(65) Prior Publication Data
US 2017/0082237 A1 Mar. 23, 2017

(30) Foreign Application Priority Data
Sep. 23, 2015 (TW) .............................. 104215324 U

(51) Int. Cl.
| | |
|---|---|
| *F16M 11/04* | (2006.01) |
| *F16M 11/18* | (2006.01) |
| *H05K 7/18* | (2006.01) |
| *F16M 11/10* | (2006.01) |
| *F16M 11/30* | (2006.01) |

(52) U.S. Cl.
CPC ............ *F16M 11/18* (2013.01); *F16M 11/046* (2013.01); *F16M 11/10* (2013.01); *F16M 11/30* (2013.01); *H05K 7/18* (2013.01); *F16M 2200/041* (2013.01); *F16M 2200/047* (2013.01); *F16M 2200/048* (2013.01)

(58) Field of Classification Search
USPC ....... 248/123.11, 123.2, 125.1, 125.2, 125.8, 248/132, 157, 161, 162.1
See application file for complete search history.

(56) References Cited

U.S. PATENT DOCUMENTS

| | | | |
|---|---|---|---|
| 6,712,321 B1 * | 3/2004 | Su ........................ | F16M 11/105 248/123.11 |
| 7,694,920 B2 * | 4/2010 | Lien ...................... | F16M 11/10 248/125.1 |
| 2008/0237414 A1 * | 10/2008 | Lien ...................... | F16M 11/10 248/125.2 |
| 2009/0039211 A1 * | 2/2009 | Hsu ....................... | F16M 11/28 248/157 |
| 2009/0159760 A1 * | 6/2009 | Gan ...................... | F16M 11/24 248/121 |
| 2010/0006716 A1 * | 1/2010 | Yen ...................... | F16M 11/10 248/125.1 |
| 2013/0233984 A1 | 9/2013 | Huang | |

\* cited by examiner

*Primary Examiner* — Alfred J Wujciak
(74) *Attorney, Agent, or Firm* — Muncy, Geissler, Olds & Lowe, P.C.

(57) ABSTRACT

A lifting structure with adjustable bearing capacity is provided. The lifting structure comprises a main body, a carrier, a main constant force spring, and at least one auxiliary constant force spring. The main body comprises at least one slide and at least one actuating module. The main constant force spring connects to the carrier. The actuating module is able to be selectively switched between a non-actuating position and an actuating position. When the carrier is driven from the top of the lifting structure along the slide, at least the main constant force spring provides a constant force to the carrier.

14 Claims, 11 Drawing Sheets

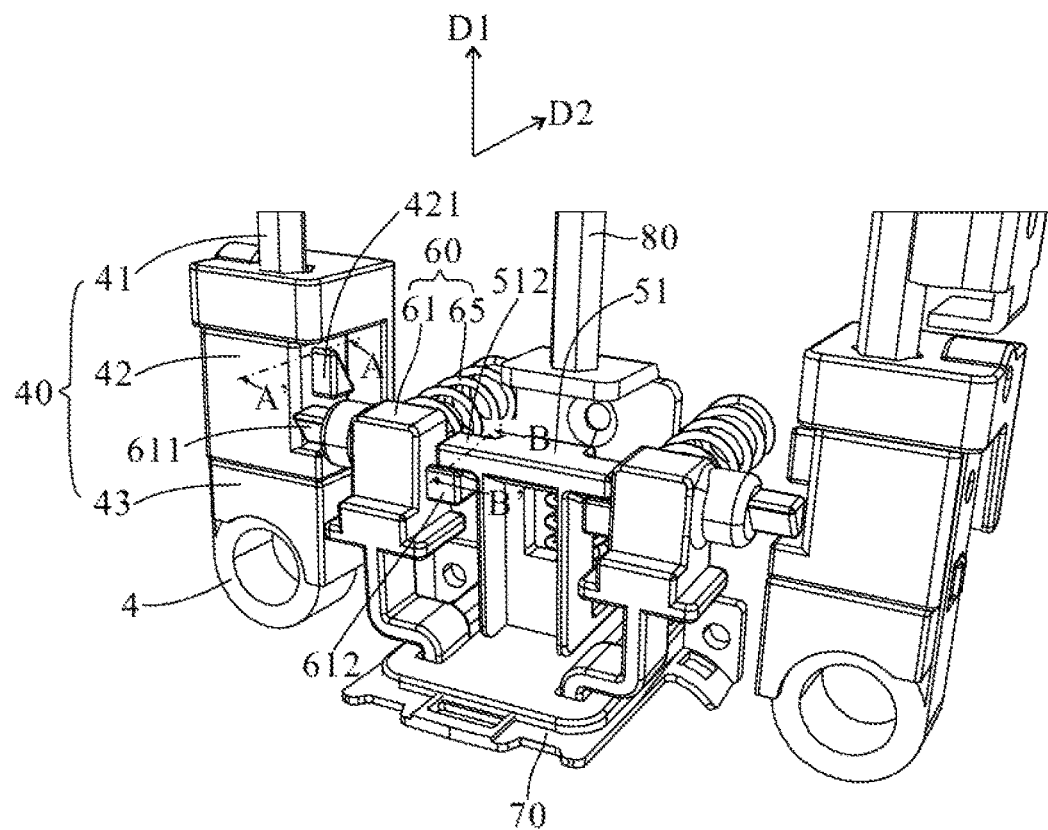
FIG. 6
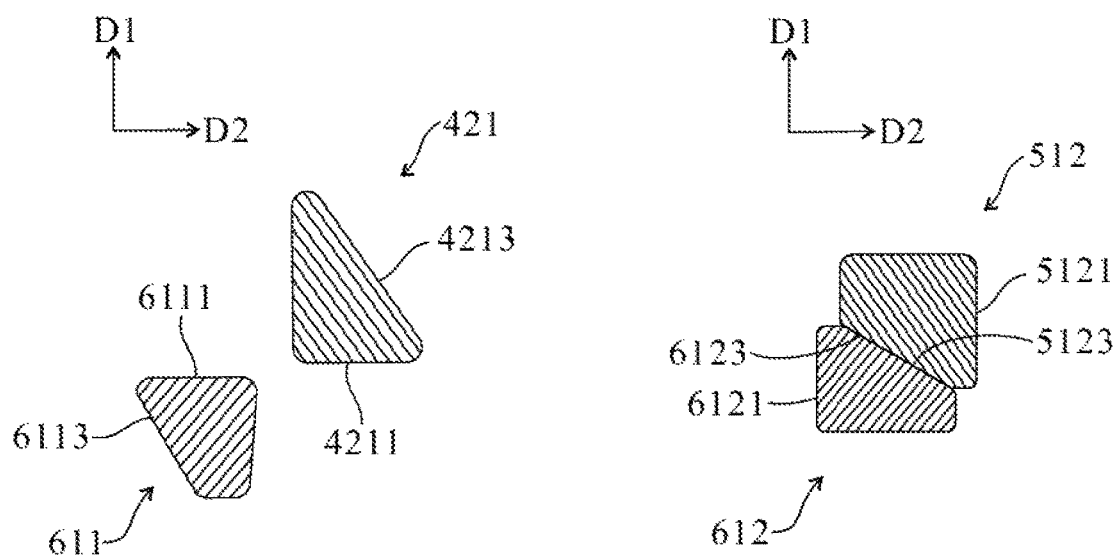
FIG. 7
FIG. 8

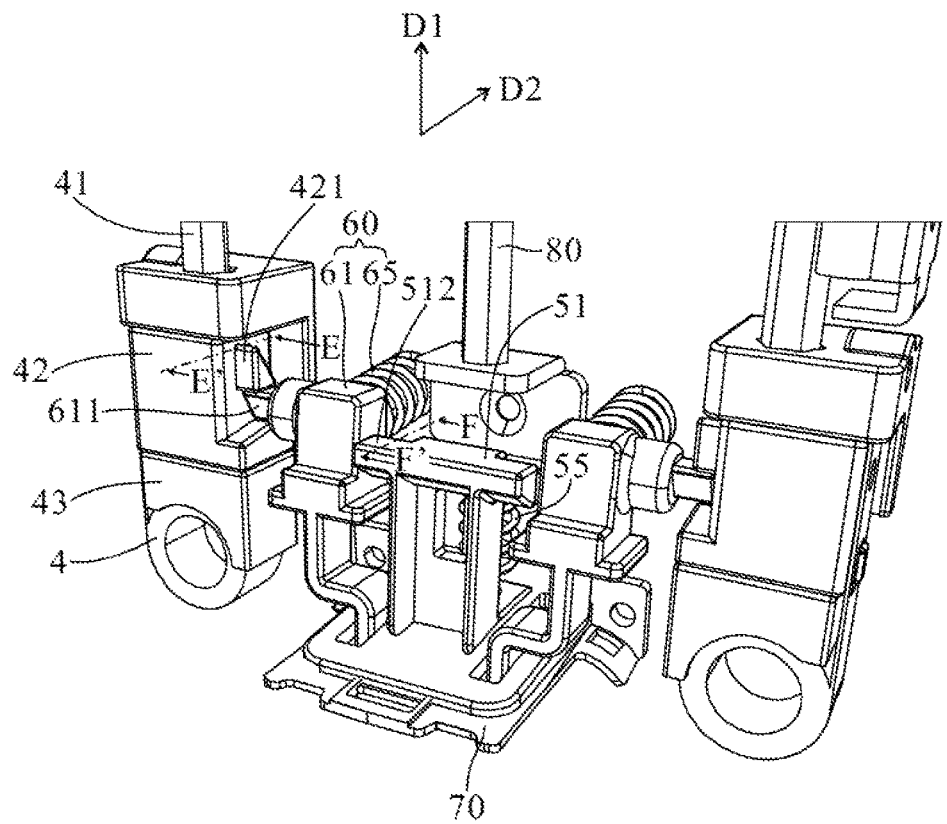
FIG. 13
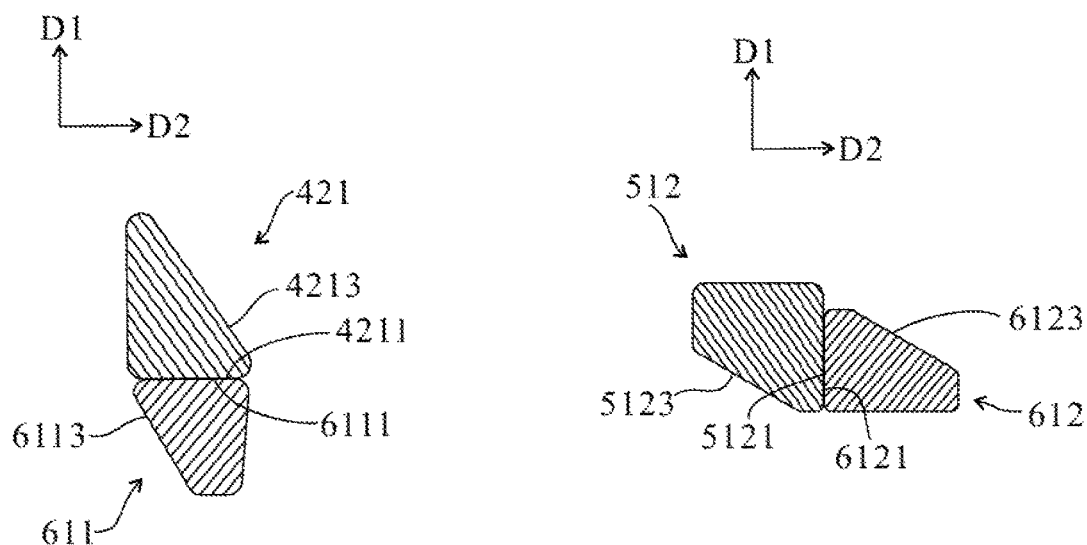
FIG. 14
FIG. 15

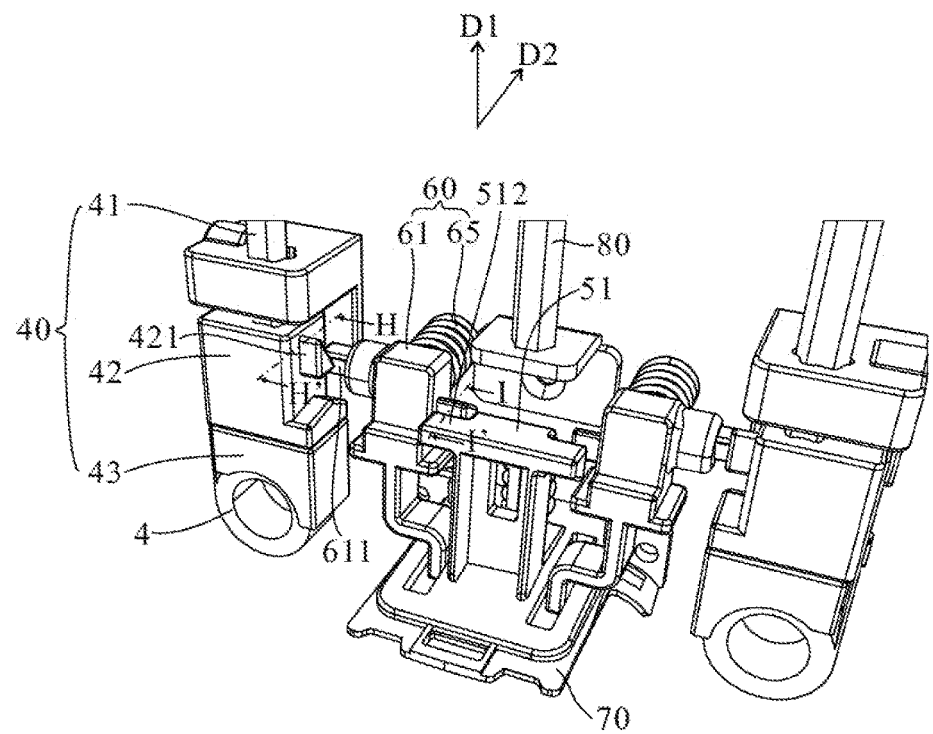
FIG. 20
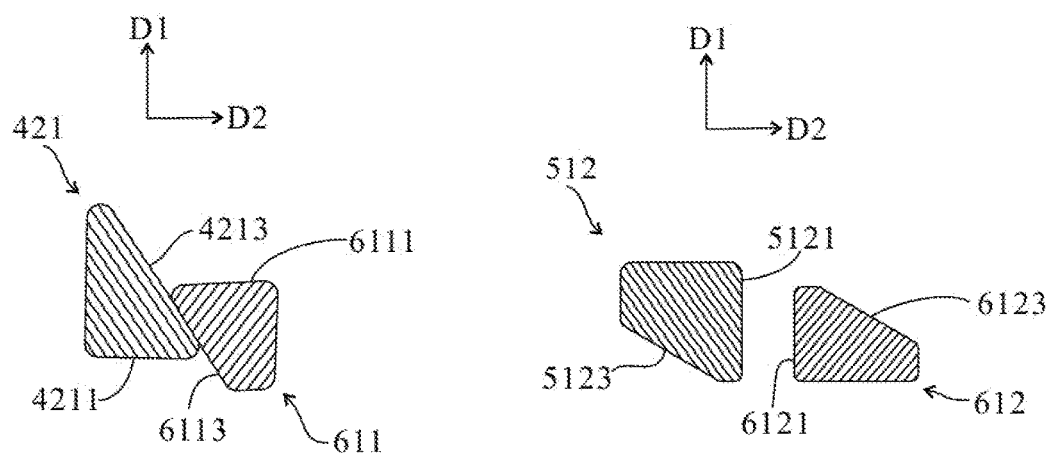
FIG. 21
FIG. 22

LIFTING STRUCTURE WITH ADJUSTABLE BEARING CAPACITY

CROSS REFERENCE TO RELATED APPLICATION

This application claims the benefits of the Taiwan Patent Application Serial Number 104215324, filed on Sep. 23, 2015, the subject matter of which is incorporated herein by reference.

BACKGROUND OF THE INVENTION

1. Field of the Invention

The present invention relates to a lifting structure, more particularly, to a lifting structure with adjustable bearing capacity for a display with a variety of size and weight.

2. Description of Related Art

A stand for a display has been disclosed in US patent NO. 2013/0233984A1, wherein the stand includes a height-adjustable structure for adjusting the height of the display when equipped with the stand. Accordingly, the bearing capacity is adjustable for various weights of displays with different sizes. The stand of the aforementioned technique includes a plurality of springs that are arranged in parallel, and each of the spring is correspondingly connected with a force member (such as a bolt or a button). The users may selectively insert the force members for controlling the actuation of the springs.

In detail, when anyone of the force members is pressed by the user, the corresponding springs and the sliding stand are driven by the inserted force members to actuate the springs, so that the corresponding springs will be stretched when the display is moved up and down. The springs may have different bearing capacity respectively, and may be chosen from the user by pressing their corresponding force member for displays with different weight; alternatively, the combinations of multiple force members may be executed by users as needed to provide an accumulated spring force for displays with larger size and weight.

In the aforementioned prior art, the height-adjustable structure utilizes the force member as a switch for actuating the springs, however, the structural accuracy thereof is less than ideal. Also, the width of the stand cannot be reduced due to the springs and the force members which are arranged in parallel, whereas the location of the switch is inconvenient to reach by the users. These drawbacks of the prior art restrict the design of the stands and result in failing to meet the user's needs.

Accordingly, the present invention provides a novel lifting structure that is desirable and has potential in the technical field.

SUMMARY OF THE INVENTION

One object of the present invention is to provide a lifting structure with adjustable bearing capacity. The lifting structure of the present invention may provide a basic bearing capacity. Besides the basic bearing capacity which may be provided by a main elastic element, the users may selectively actuate an auxiliary elastic element when needed. Once the auxiliary elastic element is actuated, the accumulated elastic force provided by the main elastic element and the auxiliary elastic element is able to carry a display with larger size and weight. According to the auxiliary elastic element of the present invention, an actuating module may be operated by the user to determine whether the auxiliary elastic element should be driven by controlling the protrusions which are abutting against or relatively sliding with each other. Therefore, the lifting structure provided by the present invention is applicable for a variety of displays with different size and weight. In the case of a lifting structure being formed with a main elastic element disposed at the center thereof and with two auxiliary elastic elements, which may be selectively actuated, disposed on both sides thereof, these elastic elements may be arranged to provide various accumulated elastic forces. The users may adjust the height where the display is equipped on the lifting structure by matching the accumulated elastic force and the weight of the display. Hence, the display may be stopped at any height on the supporting device.

The lifting structure of the present invention is also designed to prevent the structural damages caused by the wrong operation sequence. In detail, if the display were equipped on the lifting structure in advance and the main elastic element were stretched before the users found that the lifting structure was lacking bearing capacity and wished to actuate the auxiliary elastic element, the actuating module cannot be actuated anymore. In order to properly actuate the auxiliary elastic element, the carrier carrying the display should be retrieved to its original position first, and subsequently actuate a selected combination of the elastic elements. However, the actuating module does not need to be deactivated during the step of retrieving the carrier in such false operation case that has been well considered when designing the lifting structure of the present invention. With the inclined surfaces of the protrusions, the protrusions may abut against and then automatically slide aside and move back to their own original position to prevent the interferences. After retrieving to the original position (retrieving to the top portion of the lifting structure), the components of the lifting structure may automatically reset, and the auxiliary elastic element is able to be stretched and actuated for lifting the display at its predetermined position.

To achieve the abovementioned objects, the present invention provides a lifting structure with adjustable bearing capacity, which comprises a main body, a carrier, a main constant force spring, and at least one auxiliary constant spring. The main body comprises at least one slide where the carrier is connected thereto and the carrier is able to move along the slide; the main constant force spring is disposed on the main body and is connected to the carrier for constantly providing a main elastic force; and the auxiliary constant force spring comprises a main portion and a fixed end for providing an auxiliary force. The main portion and the fixed end of the auxiliary constant force spring simultaneously move along with the carrier when the fixed end is not connected to the main body, so that the auxiliary constant force spring fails to provide the auxiliary elastic force to the carrier; whereas only the main portion moves along with the carrier when the fixed end is connected to the main body, so that the auxiliary constant force spring provides the auxiliary elastic spring force to the carrier.

In one embodiment, the main body further comprises at least one actuating module which is able to be selectively switched between an actuating position and a non-actuating position; and the fixed end of the auxiliary constant force spring is connected to the main body when the actuating module is at the actuating position; whereas both main portion and the fixed end of the auxiliary constant force spring move along with the carrier when the actuating module is at the non-actuating position.

The lifting structure of the present invention further comprises at least one linkage module which includes a column body, an upper element, and a lower element, wherein the column body passes through the upper element, and has two end portions in which one is connected to the carrier and the other one is connected to the lower element, wherein the fixed end and the main portion of the auxiliary constant force spring are secured to the upper element and the lower element respectively, and the fixed end is driven by the upper element to move along the column body.

The main body further comprises a releasing module which includes a releasing element and a first return spring connected to the releasing element, wherein the first return spring pushes the releasing element in a first direction. The actuating module drives the releasing module and the releasing element overcomes an elastic force provided by the first return spring and moves along the first direction when the actuating module switches from the non-actuating position to the actuating position. The actuating module further comprises an actuating block and a second return spring connected to the actuating block, wherein the second return spring pushes the actuating block in a second direction. The actuating block is able to move along the second direction and selectively abuts against the releasing element or the upper element when the actuating block is driven to overcome an elastic force provided by the second return spring.

The upper element, the lower element, and the auxiliary constant force spring simultaneously move along with the column body in which the auxiliary constant force spring maintains in an original state when the actuating block is at the non-actuating position and the column body is driven by the carrier which is originally located at a top portion of the lifting structure. The upper element is restricted by the actuating block, and the lower element and the main portion of the auxiliary constant force spring simultaneously move along with the column body when the actuating block drives the releasing element to overcome the elastic force provided by the first return spring and moves to the actuating position. In this case, the column body is driven by the carrier which is originally located at the top portion of the lifting structure, so that the elastic force provided by the auxiliary constant force spring is transferred to the carrier.

In the present invention, an upper protrusion extends from the upper element, a release protrusion extends from the releasing element, and a first protrusion and a second protrusion extend from the actuating block. The first protrusion and the upper protrusion are able to relatively abut against or slide against each other, and the second protrusion and the release protrusion are able to abut against or slide against each other. The first protrusion has a propped surface and a first inclined surface; the second protrusion has a second propped surface and a second inclined surface; the upper protrusion has a third propped surface and a third inclined surface; and the release protrusion has a fourth propped surface and a fourth inclined surface.

When the actuating block is at the non-actuating position, the upper protrusion and the first protrusion are not overlapped in the first direction. The second inclined surface and the fourth inclined surface slide relatively against each other so as to drive the releasing element to overcome the elastic force provided by the first return spring when the actuating block is driven to move from the non-actuating position to the actuating position. Once the second protrusion and the release protrusion are no longer overlapped in the first direction, the releasing element is returned by the first return spring, and the second propped surface and the fourth propped surface abut against each other due to the second return spring. The first propped surface and the third propped surface contact and abut against each other to restrict the upper element when the actuating block is at the actuating position. The actuating block is driven by the second return spring to return to the non-actuating position when an external force is applied to the releasing element to overcome the elastic force provided by the first return spring and to drive the releasing element to move to an extent that the release protrusion and the second protrusion are no longer overlapped in the second direction.

In another embodiment of the present invention, when the actuating block is at the non-actuating position and the carrier departs from the top portion of the lifting structure to drive the upper element, the lower element, and the auxiliary constant force spring to move simultaneously along with the column body in advance, and when the actuating block is subsequently driven to switch from the non-actuating position to the actuating position and the column body subsequently drives the upper element, the lower element, and the auxiliary constant force spring to return, the first inclined surface and the third inclined surface contact with and relatively slide against each other so as to drive the actuating block to overcome the elastic force provided by the second return spring until the first protrusion and the upper protrusion are no longer overlapped in the first direction, and then the second return spring drives the actuating block returning back to the actuating position.

Preferably, the releasing element further comprises a releasing button, so that the releasing element is able to move along the first direction when the releasing button is pressed to overcome the elastic force provided by the first return spring. The at least one slide comprises two slides, the at least one linkage module comprises two linkage modules, the at least one actuating module comprises two actuating modules, and the at least one auxiliary constant force spring comprises two auxiliary constant force springs disposed respectively at two opposing sides of the lifting structure.

The lifting structure of the present invention is applied in a supporting device which comprises a base and a joint plate, wherein the lifting structure further comprises a stand connected to the base for fastening the slide, and the carrier of the lifting structure is connected to the joint plate.

Other objects, novel features, and advantages of the invention will become more apparent from the following detailed description when taken in conjunction with the accompanying drawings.

BRIEF DESCRIPTION OF THE DRAWINGS

FIG. 6 is a partial perspective view of the lifting structure when the actuating module is at the non-actuating position;

FIG. 7 is a cross-section view along the section line A-A' in FIG. 6;

FIG. 8 is a cross-section view along the section line B-B' in FIG. 6;

FIG. 13 is a partial perspective view of the lifting structure when the actuating module is at the actuating position;

FIG. 14 is a cross-section view along the section line E-E' in FIG. 13;

FIG. 15 is a cross-section view along the section line F-F' in FIG. 13;

FIG. 20 is partial perspective view of the lifting structure of a returning process after the false operation;

FIG. 21 is a cross-section view along the section line H-H' in FIG. 20; and

FIG. 22 is a cross-section view along the section line I-I' in FIG. 20.

DETAILED DESCRIPTION OF THE PREFERRED EMBODIMENT

Figure 1:
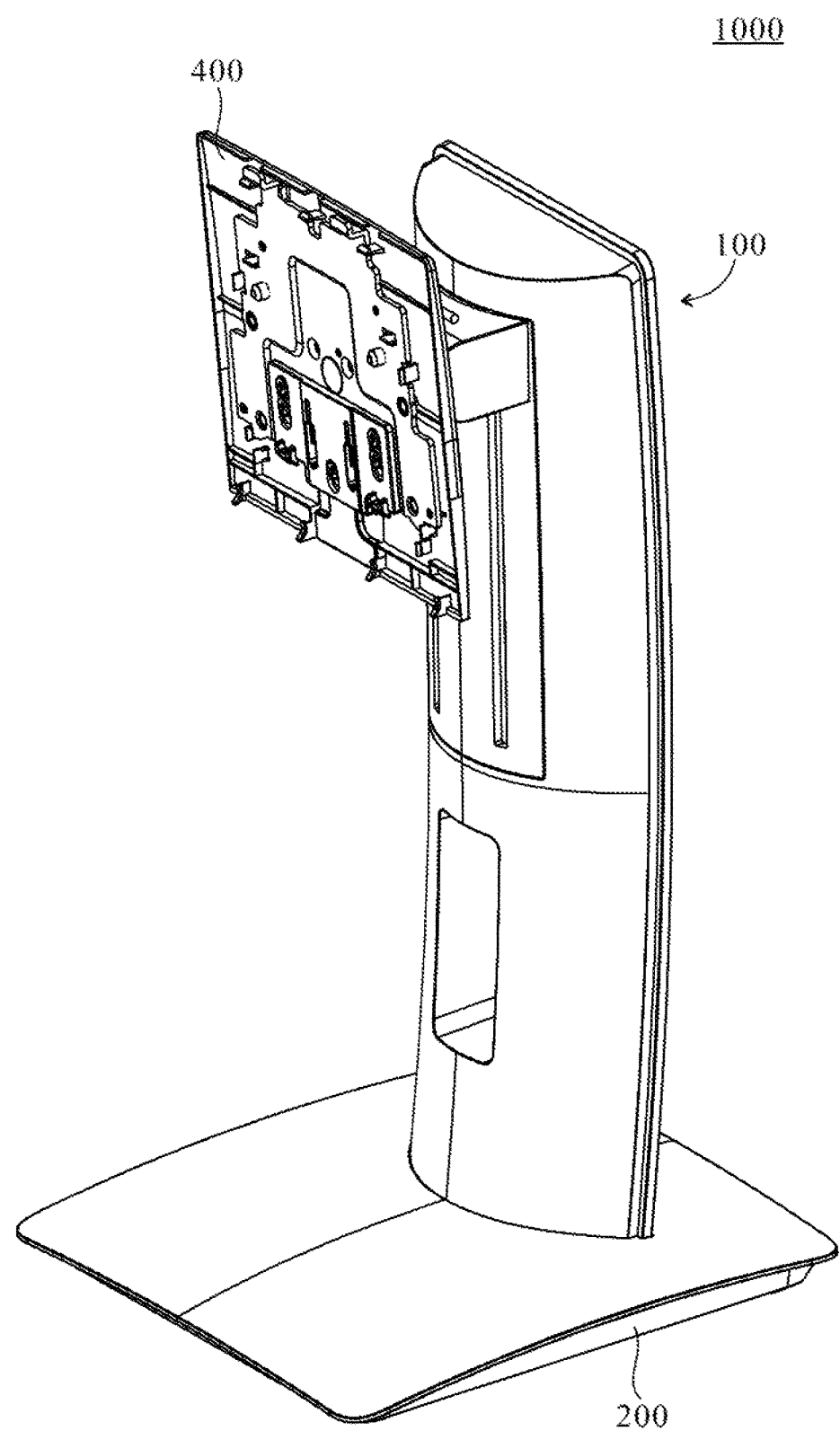
FIG. 1 is a perspective view of the supporting device of the present invention.
Figure 2:
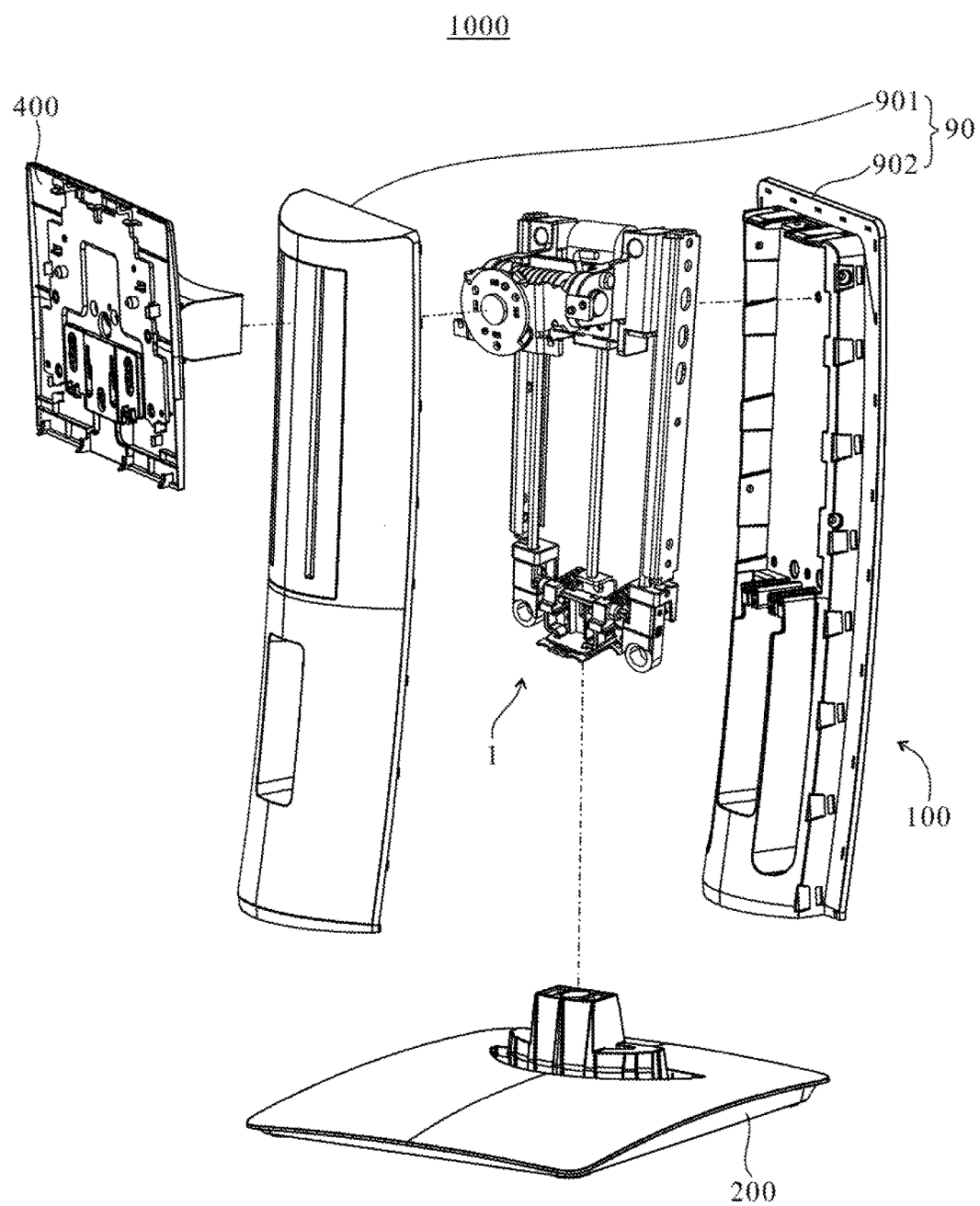
FIG. 2 is an explosive view of the supporting device of the present invention.

With reference to FIG. 1 and FIG. 2, in which the perspective view and the explosion view of the supporting device 1000 are shown. The supporting device 1000 comprises a lifting structure 100 of the present invention, a base 200, and a joint plate 400, wherein the lifting structure 100 of the present invention comprises a main body 1. The main body 1 comprises a column 90 being connected to the base 200, wherein the column 90 is composed of a front plate 901 and a rear plate 902 that are combined with each other, and the joint plate 400 actually is connected to the lifting structure 100. The supporting device 1000 may be a support stand for display devices (not shown in figures) with the joint plate 400 fastened to the backside of the display devices. The height of the display device with respect to the supporting device may be adjusted by the lifting structure 100 of the supporting device 1000, and the bearing capacity of the lifting structure 100 may be adjusted according to the weight of the lifted display device. The details thereof will be described in the following paragraphs.

Figure 3:
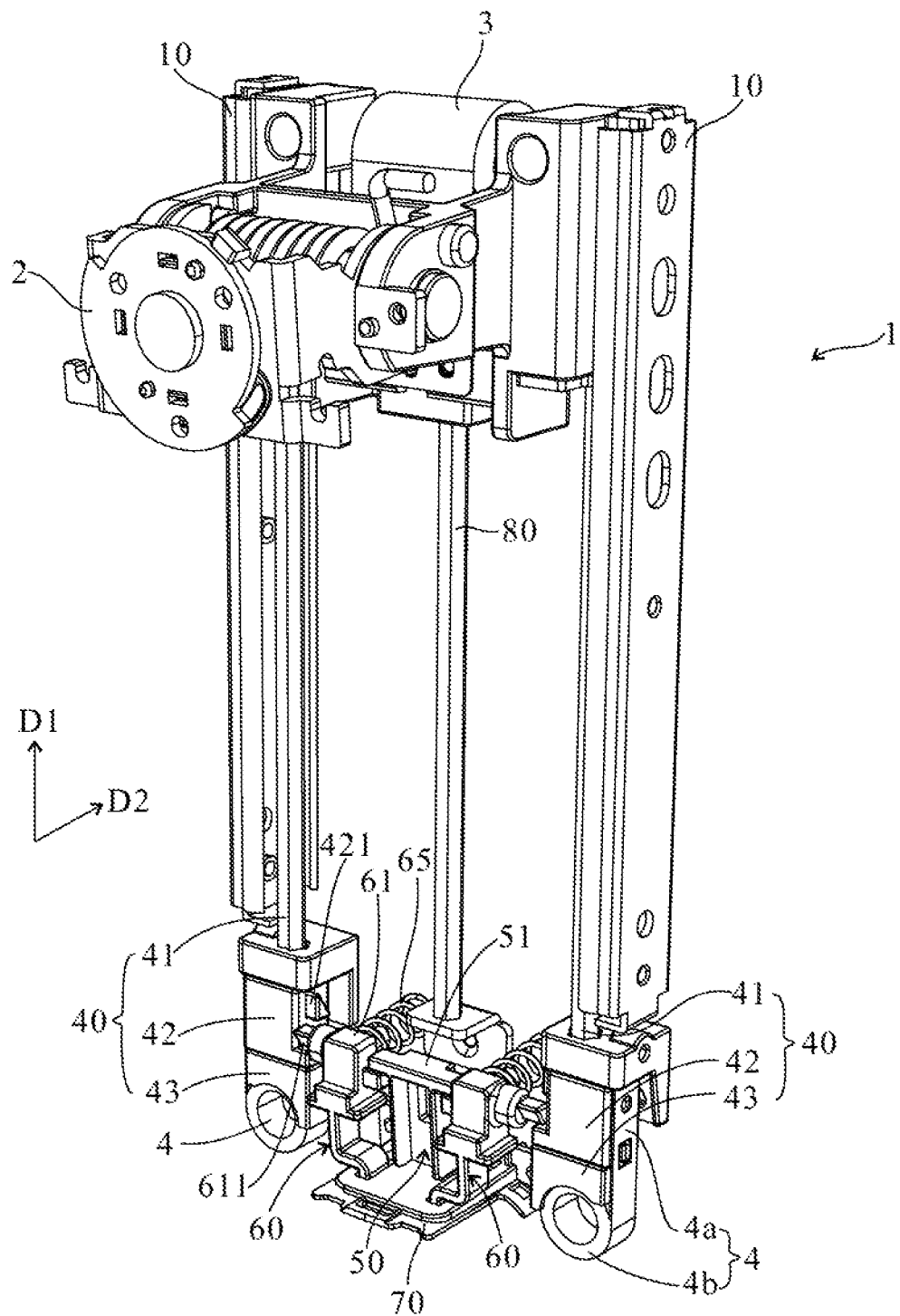
FIG. 3 is a perspective view of the lifting structure of the present invention.

Please refer to FIG. 3, which illustrates the lifting structure 100 of the present invention. The lifting structure 100 further comprises a carrier 2, a main constant force spring 3, two linkage modules 40, and two auxiliary constant force springs 4. The main body 1 further comprises two slides 10, a releasing module 50, two actuating modules 60, a base substrate 70, and a central column 80, wherein each of the linkage modules 40 comprises a column body 41, an upper element 42, and a lower element 43 respectively. The description of the following paragraph is directed to one group of the slide 10, the column body 41, the upper element 42, the lower element 43, the auxiliary constant force spring 4, and the actuating module 60. Since the function of the lifting structure 100 may be achieved by only one group or plural groups of the slides 10, the column body 41, the upper element 42, the lower element 43, the auxiliary constant force spring 4, and the actuating module 60, the number of the groups thereof is not particularly limited.

The slides 10 are separately disposed on the rear plate 902 of the column 90, the carrier 2 is disposed between the slides 10, and the central column 80 is disposed through the carrier 2, so that the carrier 2 may move along the central column 80 and the slides 10. The carrier 2 is connected to the joint plate 400 (the front plate 901 is only an outer covering, which is not physically connected to the carrier 2 or the joint plate 400 but has a slot for the carrier 2 to move therethrough). As illustrated, the base substrate 70 and the central column 80 are fixed to the column 90, wherein the base substrate 70 is fixed to the protrusion portion at the middle of the rear plate 902. The main constant force spring 3 is disposed on the top portion of the rear plate 902 of the column 90 and is connected to the carrier 2, wherein the main portion of the main constant force spring 3 is disposed on the main body 1 and is connected to the carrier 2 with a free end thereof to constantly provide a main elastic force. That is, the main constant force spring 3 is stretched to provide a constant main elastic force to pull up the carrier 2 when the carrier 2 moves along the slides 10.

The description of the following paragraph is directed to one group of the column body 41, the upper element 42, the lower element 43, and the auxiliary constant force spring 4. A top portion of the column body 41 is connected to the carrier 2, the column body 41 extends through the upper element 42 and is connected to the lower element 43 with a corresponding bottom portion so that the upper element 42 is able to slide on the column body 41. The auxiliary constant force spring comprises a main portion 4a and a fixed end 4b extending from the main portion 4a. The main portion 4a is fastened to the lower element 43 (e.g., attached to the bottom of the lower element 43) and is driven by the lower element 43. The fixed end 4b is connected to the upper element 42 so that the fixed end 4b may be driven by the upper element 42 to move along the column body 41. Apparently, the main body 1 and the fixed end 4b simultaneously move along with the carrier 2 when the fixed end 4b is not connected to the main body 1 so that the auxiliary constant force spring 4 fails to provide the auxiliary elastic force to the carrier 2. When the fixed end 4b is fixed to the main body 1, only the main portion 4a of the auxiliary constant force spring 4 simultaneously moves along with the carrier 2 so that the auxiliary constant force spring 4 provides the auxiliary elastic force to the carrier 2.

Specifically, when the upper element 42 and the lower element 43 move simultaneously, the auxiliary constant force spring 4 maintains in an original state without being stretched and thus moves simultaneously with the carrier 2, the column body 41, the upper element 42, and the lower element 43. At this point, the auxiliary elastic force provided by the auxiliary constant force spring 4 closely fit the upper element 42 on the lower element 43. On the other hand, when the upper element 42 maintains still and only the lower element 43 moves downwards (that is, the upper element 42 departs from the lower element 43 gradually), the auxiliary constant force spring 4 may be stretched since the fixed end 4b of the auxiliary constant force spring 4 is connected to the upper element 42 while the main portion 4a moves with the carrier 2, the column body 41, and the lower element 43. At this moment, the auxiliary elastic force provided by the auxiliary constant force spring 4 is transferred to the carrier 2 through the lower element 43 and the column body 41. In brief, at least the main portion 4a of the auxiliary constant force spring 4 will move with the carrier 2 when the carrier 2 moves downwards from the top portion of the lifting structure 100 of the present invention; whereas the movement of the fixed end 4b will be determined by whether the upper element 42 is restricted or not.

Figure 4:
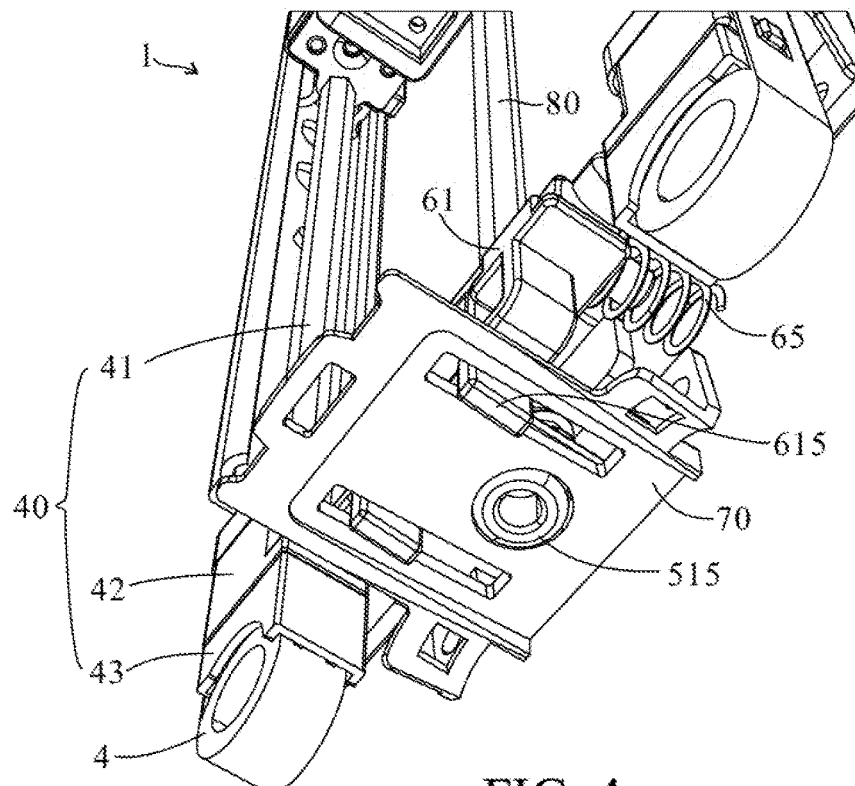
FIG. 4 is a partial bottom view of the lifting structure of the present invention.
Figure 5:
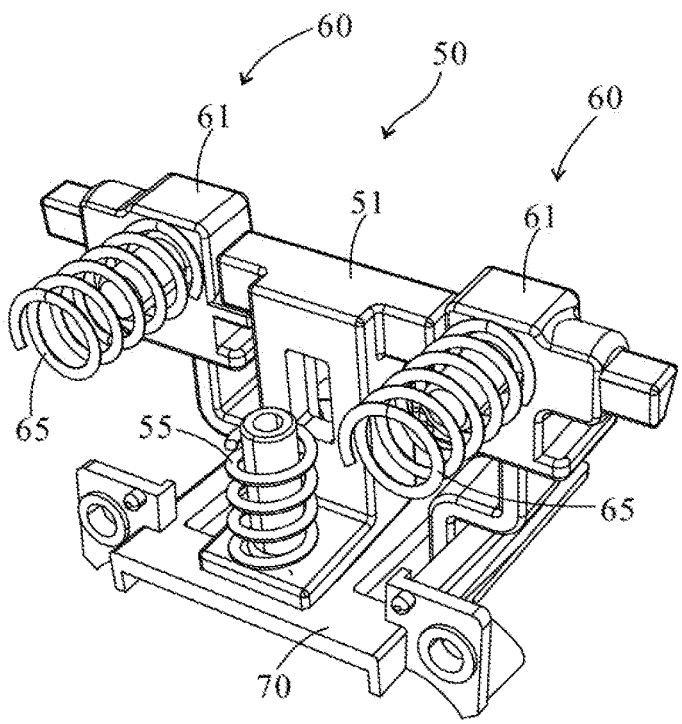
FIG. 5 is a perspective view of some elements of the lifting structure of the present invention.

The releasing module 50 is described as follows. Please refer to FIG. 3, FIG. 4, and FIG. 5, wherein FIG. 4 is a bottom view of the lifting structure 100 in one viewing angle, and FIG. 5 is a perspective view in another viewing angle from the rear side of the lifting structure 100. The releasing module 50 is disposed on the base substrate 70 and includes a releasing element 51 and a first return spring 55 connected to the releasing element 51, wherein the first return spring 55 pushes the releasing element 51 in a first direction D1 (as shown in FIG. 6). In the present embodiment, the first return spring 55 is preloaded and constantly provides a thrust force to the releasing element 51 in the first direction D1. In FIG. 5, the components at the top is omitted in order to show the details of the first return spring 55. It should be understood that the first return spring 44 tends to push the releasing element 51 in the first direction D1 to maintain the position of the releasing element 51 while the first return spring 44 is clamped and compressed. The releasing element 51 further comprises a releasing button 515 which is exposed on the bottom surface of the base substrate 70. The releasing element 51 is uplifted in the first direction D1 (the first return spring 55 is further compressed due to the movement of the releasing element 51) when the releasing button 515 is pressed, so that the auxiliary constant force spring is unactuated. The details will be described in the following paragraphs.

The actuating module 60 is described as follows. With respect to FIG. 3, the actuating module 60 is selectively connected between the upper element 42 and the releasing module 50. The actuating module 60 comprises an actuating block 61 and a second return spring 65 connected to the actuating block 61, wherein the second return spring 65 is preloaded and pushes the actuating block 61 in a second direction D2 (referring to FIG. 6). The actuating block 61 is driven to move along the second direction D2 and selectively abuts against the releasing element 51 or the upper element 42 when the actuating block 61 is driven to overcome an elastic force provided by the second return spring 65. As illustrated in FIG. 4 and FIG. 5. The actuating block 61 further includes an actuating button 615 which extends to the bottom surface of the base substrate 70 for the user's operation. The second return spring 65 may further be compressed by the actuating block 61 and switches the actuating block 61 from a non-actuating position to an actuating position when the actuating button 615 is pressed by the user; wherein the actuating position is maintained by the mechanical retaining of the structure. The second return spring 65 will release the elastic force to drive the actuating block 61 to retrieve from the actuating position to the non-actuating position once the mechanical restriction is removed. Accordingly, the actuating block 61 may be selectively switched between the actuating position and the non-actuating position. The surface where the other end of the second return spring 65 abutting against thereon is omitted in the figures of the present embodiment for detail illustration of the second return spring 65. It should be understood that one end of the second return spring 65 abuts against the actuating block 61 and the other end thereof abuts against the surface so that the second return spring 65 is clamped and compressed to provide a thrust force to the actuating block 61.

The fixed end 4b of the auxiliary constant force spring 4 is secured to the main body 1 when the actuating module 60 is at the actuating position; and the main portion 4a and the fixed end 4b of the auxiliary constant force spring 40 simultaneously move along with the carrier 2 when the actuating module 60 is at the non-actuating position. Please refer to FIG. 6, FIG. 7, and FIG. 8 for clear illustration of the effect and the interactions between the components of the actuating module 60 when the actuating block 61 is switched between the non-actuating position and the actuating position. FIG. 6 is a partial perspective view of the lifting structure 100 of the present invention when the actuating block 61 is at the non-actuating position, wherein an upper protrusion 421 extends from the upper element 42, a release protrusion 512 extends from the releasing element 51, and a first protrusion 611 and a second protrusion 612 extend from the actuating block 61. The first protrusion 611 and the upper protrusion 421 are able to relatively abut against or slide against each other, and the second protrusion 612 and the release protrusion 512 are able to relatively abut against or slide against each other. FIG. 7 is a cross-section view along the section line A-A' in FIG. 6 which shows the cross-section of the upper protrusion 421 and the first protrusion 611, and FIG. 8 is a cross-section view along the section line B-B' in FIG. 6 which shows the cross-section of the release protrusion 512 and the second protrusion 612. The first protrusion 611 has a first propped surface 6111 and a first inclined surface 6113; the second protrusion 612 has a second propped surface 6121 and a second inclined surface 6123; the upper protrusion 421 has a third propped surface 4211 and a third inclined surface 4213; and the release protrusion 512 has a fourth propped surface 5121 and a fourth inclined surface 5123.

With reference to FIG. 6 to FIG. 8, it is clear that the upper protrusion 421 and the first protrusion 611 are not overlapped in the first direction D1, and the second inclined surface 6123 of the second protrusion 612 and the fourth inclined surface 5123 of the release protrusion 512 abut against each other when the actuating block 61 is at the non-actuating position. Apparently, the upper protrusion 421 and the first protrusion 611 are not overlapped on the moving path of the upper element 42 so that the upper protrusion 421 fails to contact the first protrusion 611 when the carrier 2 moves downward along the first direction D1, therefore, the column body 41, the upper element 42, the lower element 43, and the auxiliary constant force spring 4 are driven to move downward simultaneously.

Figure 9:
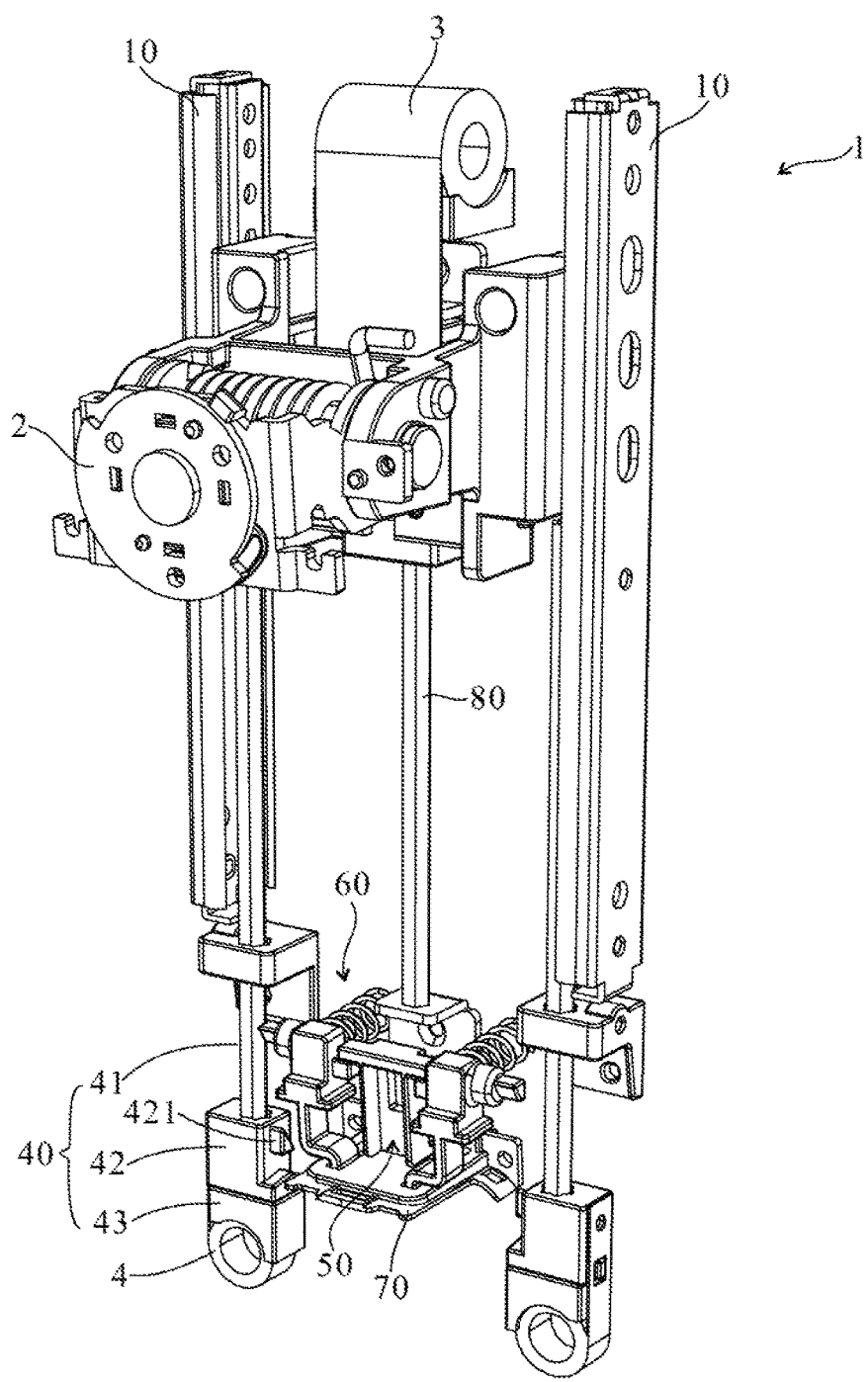
FIG. 9 is an operation perspective view of the lifting structure when the actuating module is at the non-actuating position.

It is known by comparing FIG. 3 and FIG. 9, when the actuating module 60 is at the non-actuating position and the column body 41 is driven by the carrier 2 which is originally located at a top portion of the lifting structure 100, the upper element 42, the lower element 43, and the auxiliary constant force spring 4 simultaneously move along with the column body 41 and the carrier 2. At this point, the auxiliary constant force spring 4 is not further stretched and maintains in an original state since the fixed end 4b of the auxiliary constant force spring 4 is not directly or indirectly secured to the main body 1. On the other hand, the main constant force spring 3 provides a main elastic force while the main portion of the main constant force spring 3 is fixed at the top portion of the lifting structure 100 and the free end moves along with the carrier 2. At this point, only the main elastic force provided by the main elastic force spring 3 will be transferred to the carrier 2. Also, a display with a weight (M1) which matches the main elastic force may be stopped at any height on the supporting device because the main elastic force is a constant force.

A detailed description of the switching process of the actuating module 60 from the non-actuating position to the actuating position which is driven after the actuating button

Figure 10:
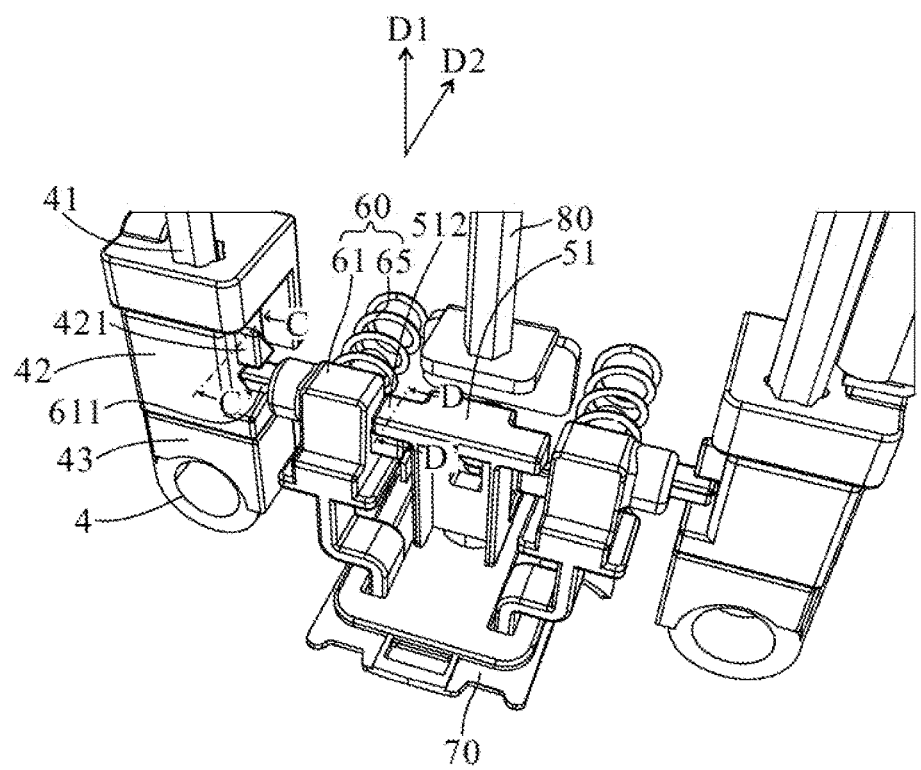
FIG. 10 is a partial perspective view of the lifting structure when the actuating module is switching to the actuating position.
Figures 11, 12:
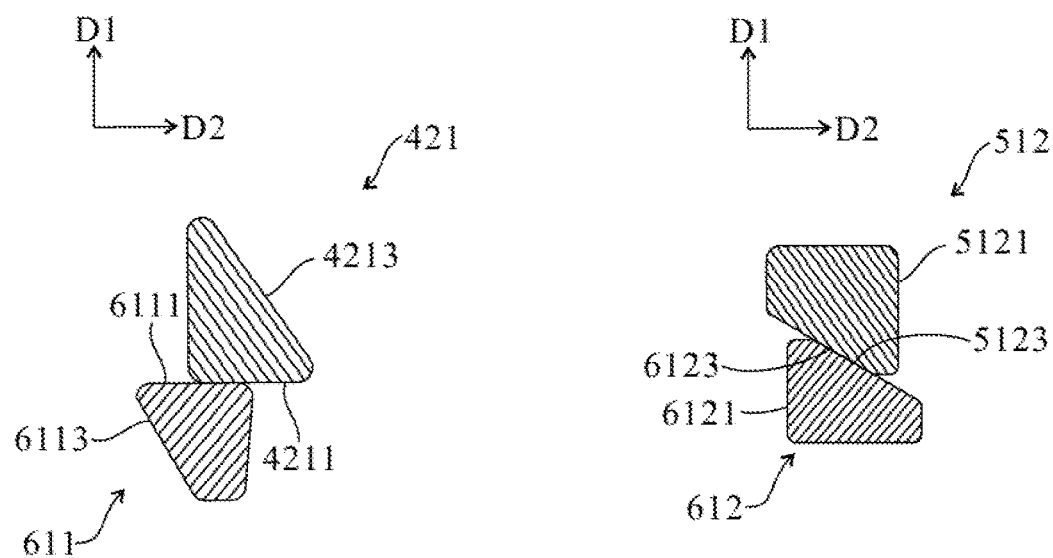
FIG. 11 is a cross-section view along the section line C-C' in FIG. 10.
FIG. 12 is a cross-section view along the section line D-D' in FIG. 10.

615, protruding from the bottom surface of the base substrate 70, was pressed by the user will be described in the following paragraph. Please refer to FIG. 10 to FIG. 12 illustrating the operation process of the actuating module 60, wherein FIG. 11 is a cross-section view along the section line C-C' in FIG. 10, which shows the cross-section of the upper protrusion 421 and the first protrusion 611, and FIG. 12 is a cross-section view along the section line D-D' in FIG. 10, which shows the cross-section of the release protrusion 512 and the second protrusion 612.

The actuating block 61 must overcome the elastic force provided by the second return spring 65 so that the second return spring 65 is compressed while a force is applied to the actuating block 61 and drives the actuating block 61 to move along the second direction D2. At this point, the first protrusion 611 and the upper protrusion 421 are partially overlapped in the first direction D1. On the other hand, the second inclined surface 6123 of the second protrusion 612 and the fourth inclined surface 5123 of the release protrusion 512 slide relatively against each other so that the release protrusion 512 is upwardly thrusted. Therefore, the external force being applied to the actuating block 61 should also drive the releasing element 51 to overcome the elastic force provided by the first return spring 55.

It is shown in FIG. 13 to FIG. 15 that the actuating block 61 is driven to be at the actuating position while the external force is continuously applied to the actuating button 615. FIG. 13 is the partial perspective view of the lifting structure 100 of the present invention when the actuating block 61 is driven to be at the actuating position, FIG. 14 is a cross-section view along the section line E-E' in FIG. 13, which shows the cross-section of the upper protrusion 421 and the first protrusion 611, and FIG. 15 is a cross-section view along the section line F-F' in FIG. 13, which shows the cross-section of the release protrusion 512 and the second protrusion 612. As illustrated, in the case that the second inclined surface 6123 and the fourth inclined surface 5123 continue to slide until the second protrusion 612 and the release protrusion 512 are no longer overlapped in the first direction D1, the second inclined surface 6123 of the second protrusion 612 completely cross over the fourth inclined surface 5123 of the release protrusion 512 and the second inclined surface 6123 and the fourth inclined surface no longer slide against each other. At this point, the external force applied to the first return spring 55 is unloaded, and thus the elastic force provided by the first return spring 55 is released immediately to retrieve the releasing element 51. As shown in FIG. 14 and FIG. 15, the second protrusion 612 and the release protrusion 512 now contact with each other via the second propped surface 6121 and the fourth propped surface 5121, and the first protrusion 611 and the upper protrusion 421 are overlapped with each other in the first direction D1.

Specifically, the second return spring 65 is compressed when the actuating block 61 moved to the actuating position, therefore, the second propped surface 6121 of the second protrusion 612 and the fourth propped surface 5121 of the release protrusion 512 closely abut against each other due to the force provided by the second return spring 65 being continuously applied to the actuating block 61 in the second direction D2 when the releasing element 51 is retrieved by the first return spring 55. Please refer to FIG. 16, the first protrusion 611 and the upper protrusion 421 are overlapped in the first direction D1, therefore, the upper element 42 is restricted when the column body 41 moves downward and the first propped surface 6111 of the first protrusion 611 and the third propped surface 4211 of the upper protrusion 421 abut against with each other.

More specifically, since the fixed end 4b of the auxiliary constant force spring 4 is connected to the upper element 42 which is restricted by the actuating block 61, the fixed end 4b of the auxiliary constant force spring 4 is secured to the actuating block 61 of the main body 1 through the upper element 42. When the column body 41 is driven by the carrier 2 which is originally located at the top portion of the lifting structure 100 and moves downwards from the top portion, only the lower element 43 and the main portion 4a of the auxiliary constant force spring 4 simultaneously move along with the carrier 2 and the column body 41. Accordingly, the auxiliary constant force spring 4 is stretched and the auxiliary elastic force provided thereby is transferred to the carrier 2 through the column body 41. In addition to the main elastic force, a display with greater weight (M2, wherein M2>M1) may be equipped to the lifting structure 100 and may be stopped at any height on the supporting device.

Figures 16, 17:
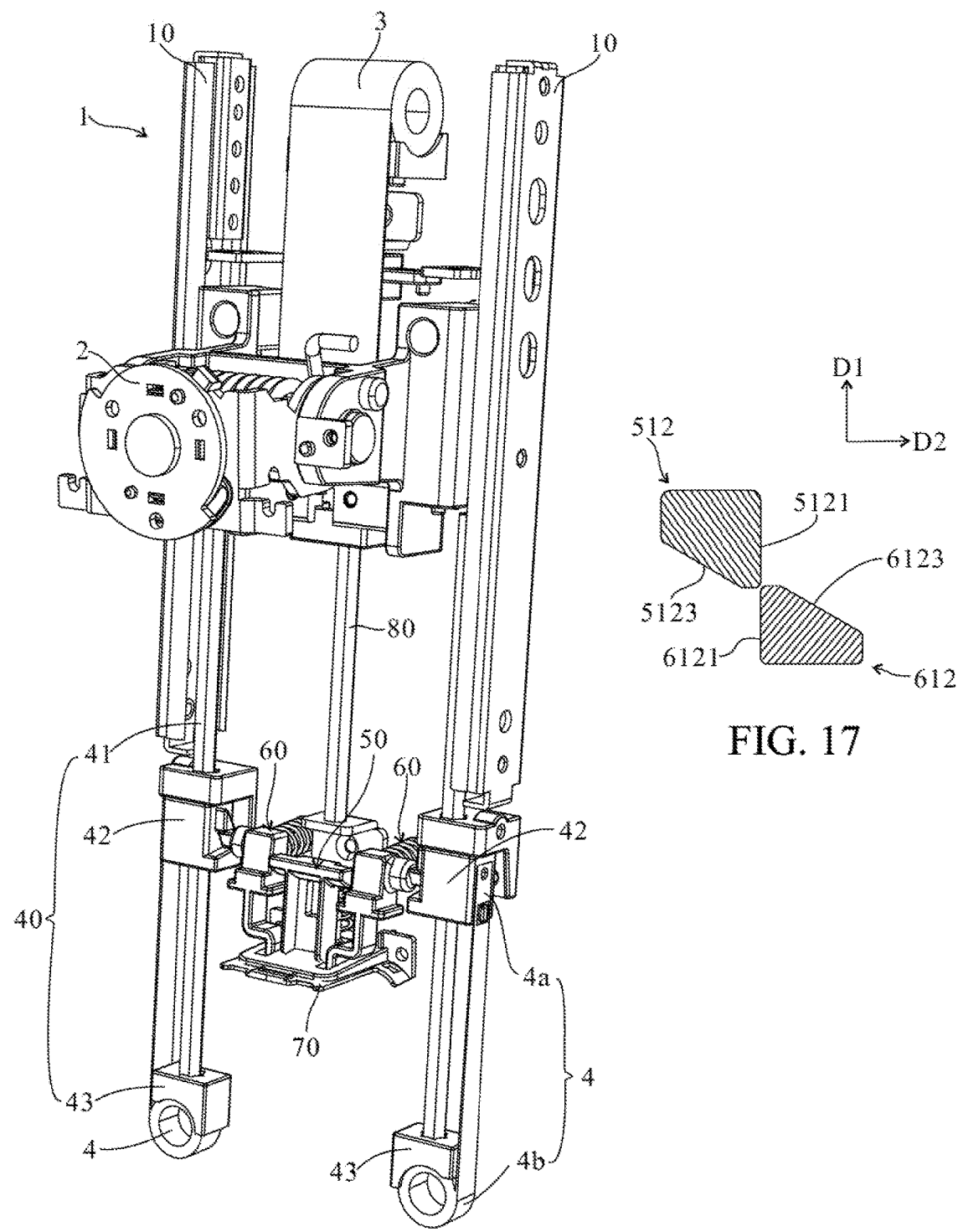
FIG. 16 is a perspective view when the lifting structure is at the actuating position.
FIG. 17 is a cross-section view of the releasing block and the second protrusion when the releasing button is pressed.

The following paragraph will describe the relative technical features of pressing the releasing button 515 to unload the auxiliary constant force spring 4 when the auxiliary elastic force in no longer needed. In the case that the releasing button 515 is exposed at the bottom surface of the base substrate 70 in the present embodiment, the releasing button 515 is uplifted along the first direction D1 when the releasing button 515 is pressed by the users. Specifically, as illustrated in FIG. 17, when an external force is applied to the releasing button 515 of the releasing element 51, the first return spring 55 is further compressed by the releasing element 51 so as to drive the releasing element 51 and the release protrusion 512 thereof to move in the first direction D1 until the release protrusion 512 and the second protrusion 612 are no longer overlapped in the second direction D2.

Since the second propped surface 6121 of the second protrusion 612 and the fourth propped surface 5121 of the release protrusion 512 fail to abut against each other as they are no longer overlapped, the elastic force from the second return spring 65 is subsequently released and driving the actuating block 61 to retrieve to the non-actuating position. At this point, the configuration of the upper protrusion 42, the actuating block 61 and the releasing element 51 return to the original state as illustrated in FIG. 6 to FIG. 8.

The auxiliary constant force spring 4 would be correctly actuated by pressing the actuating button 615 when the carrier 2 is located at the top portion of the lifting structure 100. Therefore, another embodiment of the present invention shows the relocating process in the case that the actuating button 615 is pressed when the carrier 2 is not located at the top portion of the lifting structure 100, and thereafter the carrier 2 is driven back to the top portion of the lifting structure 100 without structural conflict. The auxiliary constant spring 4 is able to be actuated correctly when the carrier 2 move downward again from the top portion of the lifting structure 100. Accordingly, the lifting structure 100 of the present invention is also characterized in fool proof.

Figures 18, 19:
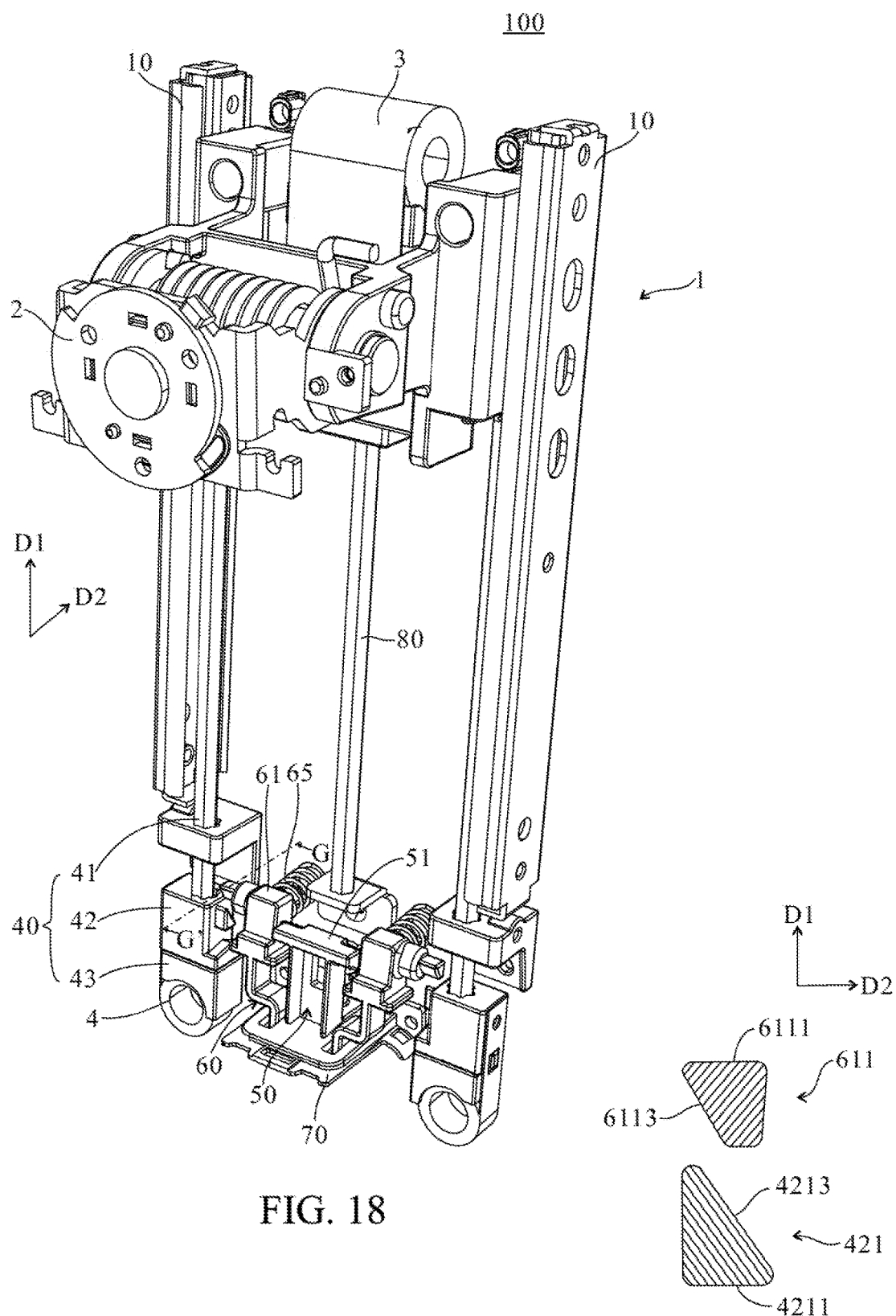
FIG. 18 is a perspective view of the lifting structure when the lifting structure is in a false operation.
FIG. 19 is a cross-section view along the section line G-G' in FIG. 18.

Specifically, as illustrated in FIG. 18, when the users fail to correctly operate the lifting structure based on the operation steps disclosed in the aforementioned embodiment, for example, in the case that the display weighing M2 is equipped onto the carrier 2 by the user when the actuating block 61 is at the non-actuating position, the carrier 2 subsequently departs from the top portion of the lifting structure 100 and drives the column body 41 along with the upper element 42, the lower element 43, and the auxiliary constant force spring 4 to simultaneously move downward along the first direction D1 without actuating the auxiliary constant force spring 4. However, if the actuating button 615 is pressed to drive the actuating block 61 to switch from the non-actuating position to the actuating position when the users found that the lifting structure is lacking bearing capacity, the auxiliary constant force spring 4 will not be actuated because the upper element 42 has moved downward. The relative position of the release protrusion 512 and the second protrusion 612 is shown in FIG. 15 and will not be described repeatedly. FIG. 19 is a cross-section view along the section line G-G' in FIG. 18, which shows the cross-section of the upper protrusion 421 and the first protrusion 611. The relative position of the first protrusion 611 and the upper protrusion 421 is clearly shown in FIG. 19 that the upper protrusion 421 and the first protrusion 611 are overlapped in the first direction D1.

The process of adjusting the carrier 2 to return to the top portion of the lifting structure 100 is shown in FIG. 20 to FIG. 22, wherein FIG. 20 is a partial perspective view of the lifting structure 100, FIG. 21 is a cross-section view along the section line H-H' in FIG. 20, which shows the cross section of the upper protrusion 421 and the first protrusion 611, and FIG. 22 is a cross-section view along the section line I-I' in FIG. 20, which shows the cross section of the release protrusion 512 and the second protrusion 612. It can be realized from the illustration of FIG. 21 that the first inclined surface 6113 of the first protrusion 611 and the third inclined surface 4213 of the upper protrusion 421 contact to each other and slide against each other so that the first protrusion 611 is thrusted by the upper protrusion 421 towards the second direction D2 and drives the actuating block 61 to further compress the second return spring 65. As illustrated in FIG. 22, the second protrusion 612 departs from the release protrusion 512 in the second direction D2.

While the first protrusion 611 and the upper protrusion 421 are no longer overlapped with each other in the first direction D1, the third inclined surface 4213 of the upper protrusion 421 has completely passed through the first inclined surface 6113 of the first protrusion 611 and terminates the slide therebetween. Therefore, the actuating block 61 is subsequently driven by the second return spring 65 to retrieve to the actuating position. The configuration of the components of the lifting structure 100 is shown in FIG. 13, and the relative configuration between the upper protrusion 421 and the first protrusion 611, and between the release protrusion 512 and the second protrusion 612 are shown in FIG. 14 and FIG. 15.

Accordingly, if the user inadvertently misuses the lifting structure 100, the structural conflict between the components will be automatically excluded when retrieving to its original state. Besides, the actuating block 61 is still at the actuating position driven by the actuating button 615 which is previously pressed by the users.

The aforementioned embodiments mainly described the actuating module 60, the column body 41, the upper element 42, the lower element 43 and the auxiliary constant force spring 4 on the single side of the lifting structure 100, however, the both sides of the lifting structure 100 are configured correspondingly as mentioned in the aforementioned paragraphs and figures, and may be operated separately as needed. Furthermore, two auxiliary constant force springs 4 may be springs with different types and capabilities having a first auxiliary elastic force and a second auxiliary elastic force respectively. As a result, the lifting structure 100 may provide four different bearing capacities for users to choose according to their needs, wherein the four different bearing capacities are: (1) main elastic force only, (2) the accumulated force of the main elastic force and the first auxiliary elastic force, (3) the accumulated force of the main elastic force and the second auxiliary elastic force, and (4) the accumulated force of the main elastic force, the first auxiliary elastic force, and the second auxiliary elastic force.

In summary, in addition to a basic bearing capacity, the users may selectively actuate the auxiliary elastic elements to adjust the bearing capacity of the lifting structure of the present invention to meet their requirements. The lifting structure also has a fool proof design for preventing the structural damages caused by false operation, and each of the components of the lifting structure may smoothly retrieve without interferences.

The above description is given by way of example, and not limitation. Given the above disclosure, one skilled in the art could devise variations that are within the scope and spirit of the invention disclosed herein, including configurations, materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A lifting structure with adjustable bearing capacity for supporting a variety of displays, comprising:
    a main body comprising at least one slide;
    a carrier connected to the slide and being able to move along the slide for supporting the display;
    a main constant force spring connected to the carrier for constantly providing a main elastic force;
    at least one linkage module including a column body, an upper element, and a lower element, wherein the column body passes through the upper element and has two end portions in which one is connected to the carrier and the other one is connected to the lower element; and
    at least one auxiliary constant force spring comprising a main portion and a fixed end for providing an auxiliary elastic force, wherein the fixed end and the main portion of the auxiliary constant force spring are secured to the upper element and the lower element respectively, and the fixed end is driven by the upper element to move along the column body;
    wherein the main body further comprises at least one actuating module being able to be selectively switched between a non-actuating position and an actuating position; and both the main portion and the fixed end of the auxiliary constant force spring simultaneously move along with the carrier when the actuating module is at the non-actuating position so that the auxiliary constant force spring fails to provide the auxiliary elastic force to the carrier; and wherein only the main portion of the auxiliary constant force spring simultaneously moves along with the carrier and the fixed end of the auxiliary constant force spring is abutted to the main body when the actuating module is at the actuating position so that the auxiliary constant force spring provides the auxiliary elastic force to the carrier.

2. The lifting structure as claimed in claim 1, wherein the main body further comprises a releasing module which includes a releasing element and a first return spring connected to the releasing element, wherein the first return spring pushes the releasing element in a first direction; and wherein the actuating module drives the releasing module to overcome an elastic force provided by the first return spring and to move along the first direction when the actuating module switches from the non-actuating position to the actuating position.

3. The lifting structure as claimed in claim 2, wherein the actuating module comprises an actuating block and a second return spring connected to the actuating block to push the actuating block in a second direction; and wherein the actuating block is able to move along the second direction and selectively abuts against the releasing element or the upper element when the actuating block is driven to overcome an elastic force provided by the second return spring.

4. The lifting structure as claimed in claim 3, wherein the upper element, the lower element, and the auxiliary constant force spring simultaneously move along with the column body in which the auxiliary constant force spring maintains in an original state when the actuating block is at the non-actuating position and the column body is driven by the carrier which is originally located at a top portion of the lifting structure; and wherein the upper element is restricted by the actuating block, and the lower element and the main portion of the auxiliary constant force spring simultaneously move along with the column body when the actuating block drives the releasing element to overcome the elastic force provided by the first return spring and moves to the actuating position, and the column body is driven by the carrier which is originally located at the top portion of the lifting structure, so that the elastic force provided by the auxiliary constant force spring is transferred to the carrier.

5. The lifting structure as claimed in claim 4, wherein an upper protrusion extends from the upper element, a release protrusion extends from the releasing element, and a first protrusion and a second protrusion extend from the actuating block, in which the first protrusion and the upper protrusion are able to relatively abut against or slide against each other, and the second protrusion and the release protrusion are able to relatively abut against or slide against each other.

6. The lifting structure as claimed in claim 5, wherein the first protrusion has a first propped surface and a first inclined surface; the second protrusion has a second propped surface and a second inclined surface; the upper protrusion has a third propped surface and a third inclined surface; and the release protrusion has a fourth propped surface and a fourth inclined surface.

7. The lifting structure as claimed in claim 6, wherein when the actuating block is at the non-actuating position, the upper protrusion and the first protrusion are not overlapped in the first direction.

8. The lifting structure as claimed in claim 7, wherein the second inclined surface and the fourth inclined surface slide relatively against each other so as to drive the release protrusion to overcome the elastic force provided by the first return spring when the actuating block is driven from the non-actuating position to the actuating position; once the second protrusion and the release protrusion are no longer overlapped in the first direction, the releasing element is returned by the first return spring, and the second propped surface and the fourth propped surface abut against each other due to the second return spring.

9. The lifting structure as claimed in claim 8, wherein the first propped surface and the third propped surface contact and abut against each other to restrict the upper element when the actuating block is at the actuating position.

10. The lifting structure as claimed in claim 9, wherein the actuating block is driven by the second return spring to return to the non-actuating position when an external force is applied to the releasing element to overcome the elastic force provided by the first return spring and to drive the releasing element to move to an extent that the release protrusion and the second protrusion are no longer overlapped in the second direction.

11. The lifting structure as claimed in claim 7, wherein when the actuating block is at the non-actuating position and the carrier departs from the top portion of the lifting structure to drive the upper element, the lower element, and the auxiliary constant force spring to move simultaneously along with the column body in advance, and when the actuating block is subsequently driven to switch from the non-actuating position to the actuating position and the column body subsequently drives the upper element, the lower element, and the auxiliary constant force spring to return, the first inclined surface and the third inclined surface contact with and relatively slide against each other so as to drive the actuating block to overcome the elastic force provided by the second return spring until the first protrusion and the upper protrusion are no longer overlapped in the first direction, and then the second return spring drives the actuating block returning back to the actuating position.

12. The lifting structure as claimed in claim 2, wherein the releasing element further comprises a releasing button, so that the releasing element is able to move along the first direction when the releasing button is pressed to overcome the elastic force provided by the first return spring.

13. The lifting structure as claimed in claim 1, wherein the at least one slide comprises two slides, the at least one linkage module comprises two linkage modules, the at least one actuating module comprises two actuating modules, and the at least one auxiliary constant force spring comprises two auxiliary constant force springs disposed respectively at two opposing sides of the lifting structure.

14. The lifting structure as claimed in claim 1, wherein the lifting structure is applied in a supporting device which comprises a base and a joint plate, wherein the main body of the lifting structure further comprises a column connected to the base, and the carrier of the lifting structure is connected to the joint plate.

* * * * *